US005757693A

United States Patent [19]

Houghton et al.

[11] Patent Number: 5,757,693
[45] Date of Patent: May 26, 1998

[54] GAIN MEMORY CELL WITH DIODE

[75] Inventors: Russell J. Houghton, Essex Junction; Claude L. Bertin, South Burlington; John A. Fifield; Christopher P. Miller, both of Underhill; William R. Tonti, Essex Junction, all of Vt.

[73] Assignee: International Business Machines Corporation, Armonk, N.Y.

[21] Appl. No.: 803,056

[22] Filed: Feb. 19, 1997

[51] Int. Cl.[6] ............................................. G11C 11/24
[52] U.S. Cl. ............................... 365/149; 365/230.05
[58] Field of Search ....................... 365/149, 230.05; 257/296

[56] References Cited

U.S. PATENT DOCUMENTS

| | | | |
|---|---|---|---|
| 4,193,127 | 3/1980 | Gersbach | 365/174 |
| 4,417,325 | 11/1983 | Harari | 365/185.08 |
| 4,431,305 | 2/1984 | Malaviya | 365/182 |
| 4,448,400 | 5/1984 | Harari | 365/185.03 |
| 4,543,597 | 9/1985 | Shibata | 257/296 |
| 4,612,629 | 9/1986 | Harari | 365/185.08 |
| 4,920,513 | 4/1990 | Takeshita | 365/149 |
| 4,989,055 | 1/1991 | Redwine | 257/302 |
| 5,359,215 | 10/1994 | Konishi | 257/296 |
| 5,463,234 | 10/1995 | Toriumi et al. | 257/296 |
| 5,652,728 | 7/1997 | Hosotani | 365/149 |

FOREIGN PATENT DOCUMENTS 62-141693  6/1987  Japan.

*Primary Examiner*—A. Zarabian
*Attorney, Agent, or Firm*—Schmeiser, Olsen & Watts; Robert A. Walsh

[57] ABSTRACT

A gain cell in a memory array having read and write bitlines and wordlines, wherein the gain cell comprises a write transistor, a storage node, a read transistor, and a diode is disclosed. The write transistor allows the value of the write bitline to be stored onto the storage node when activated by the write wordline. The read transistor, which allows the stored value to be read, is coupled to the storage node and to the read bitline via the diode. The diode prevents the conduction of the read transistor in the opposite direction, thus preventing read interference from other cells and reducing bitline capacitance.

20 Claims, 2 Drawing Sheets

GAIN MEMORY CELL WITH DIODE

RELATED APPLICATION

This application is a sister application to "Multi-level Storage Gain Cell with Stepline", by Bertin et al., assigned to the assignee of record and filed concurrently herewith.

BACKGROUND OF THE INVENTION

1. Technical Field

The invention relates generally to semiconductor memory cells, and more specifically, to semiconductor gain memory cells.

2. Background Art

One method of constructing semiconductor memory arrays, specifically dynamic random access memory (DRAM) arrays, is through the use of gain cells. A gain cell basically comprises a write transistor, which allows values to be written into that gain cell, a storage node, which stores the values, and a read device, such as a transistor, which allows the stored values to be read. Some examples of gain cells for memory arrays are found in the following U.S. Patents: U.S. Pat. No. 5,463,234, "High Speed Semiconductor Gain Memory Cell with Minimal Area Occupancy", issued October 1995 to Toriumi et al.; U.S. Pat. No. 4,989,055, "Dynamic Random Access Memory Cell", issued January 1991 to Redwine; and U.S. Pat. No. 4,612,629, "Highly Scalable Dynamic RAM Cell with Self-Signal Amplification", issued September 1986 to Harari. The gain cells as disclosed in the aforementioned patents are beneficial to DRAMs because of their smaller storage capacitance, and reduction in memory array area.

Gain cells in a memory array area typically share read/write bitlines and wordlines, hence further reducing memory array area. Unfortunately, sharing the same bitline when using the gain cells of the aforementioned patents may cause read interference from the unselected cells. That is, the read device of an unselected cell may improperly conduct as the selected gain cell is being read. Thus, the bitline voltage swing is limited and the typical sensing device for the memory array (e.g., a CMOS inverter) may not sense the limited voltage swing. Without a proper read out, the DRAM becomes unreliable and/or will need a more complex sensing device.

Accordingly, a need has developed in the art for a gain cell in a memory array area that will prevent read interference from unselected cells, thus, allowing a larger bitline voltage swing.

SUMMARY OF THE INVENTION

It is thus an advantage of the present invention to provide a gain cell in a memory array area that will prevent read interference from unselected cells.

It is also an advantage of the present invention to provide a gain cell in a memory array area that reduces bitline capacitance.

The foregoing and other advantages of the invention are realized by a gain cell in a memory array having read and write bitlines and wordlines, wherein the gain cell comprises a write transistor, a storage node, a read transistor, and a diode. The write transistor allows the value of the write bitline to be stored onto the storage node when activated by the write wordline. The read transistor, which allows the stored value to be read, is coupled to the storage node and to the read bitline via the diode. The diode prevents the conduction of the read transistor in the opposite direction, thus preventing read interference from other cells and reducing bitline capacitance.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
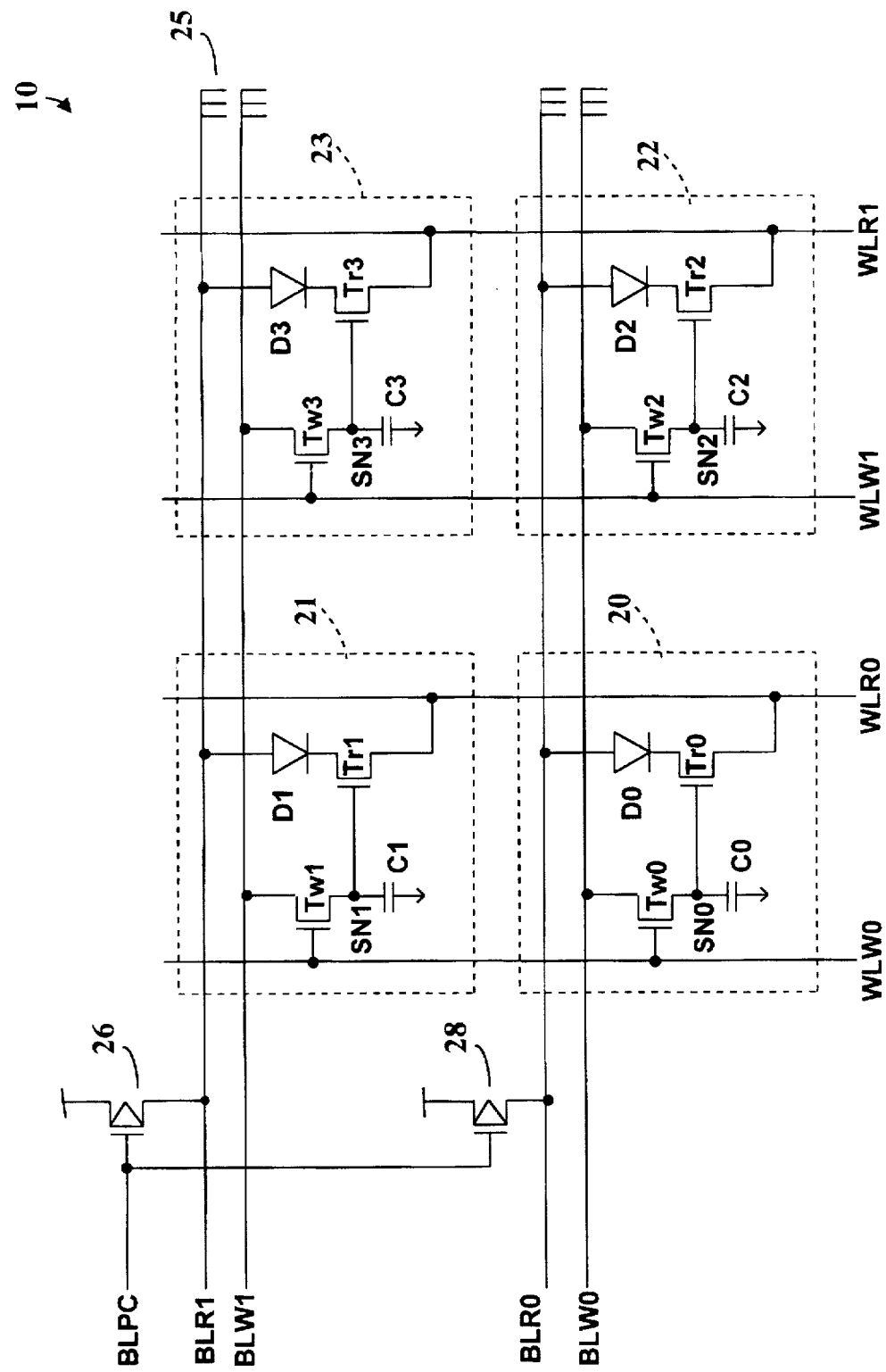
FIG. 1 is a memory array system having a gain cell circuit in accordance with a preferred embodiment of the present invention.

Referring to FIG. 1, a memory array system 10 comprising a matrix of gain cells 20–23 in accordance with a preferred embodiment of the present invention is disclosed. Other gain cells are indicated through fanout symbol 25, the amount of gain cells utilized being determined by the desired size and storage capability of the memory. Memory array system 10 also comprises read and write wordlines (WLR0, WLW0, WLR1, WLW1, etc.), read and write bitlines (BLR0, BLW0, BLR1, BLW1, etc.), and read bitline precharge (BLPC) with precharge transistors 26, 28. Gain cell 20, as with all the other gain cells of the present invention, comprises write transistor Tw0, capacitor C0, storage node SN0, read transistor Tr0, and diode D0. D0 is preferably a Schottky diode, though it is not limited to such. The gate of Tw0 is coupled to WLW0, the source of Tw0 is coupled to BLW0 and the drain is coupled to SN0 and C0, which is tied to ground. The gate of Tr0 is coupled to SN0, the source is coupled to WLR0, and the drain is coupled to BLR0 through D0. Nondestructive readout (NDRO) can be achieved through the transistor amplification of the charge stored at storage node SN0. In this embodiment, Tw0 and Tr0 are n-channel field-effect transistors (NFETs), but other transistors that similarly achieve NDR0, such as p-channel field-effect transistors (PFETs) may also be used.

For a write operation, the value of BLW0 is written into capacitor C0 when WLW0 is driven high. That is, WLW0 will activate Tw0, allowing the voltage on BLW0 to be gated through to SN0. The voltage at SN0 will then represent the value that was written to gain cell 20.

For a read operation, WLR0 is driven low (or in the case of Tr0 being a PFET, WLR0 is driven high), and BLR0 conducts when the voltage of WLR0 (Vr) is less than the storage node voltage (Vsn) minus the threshold voltage of Tr0 (Vth), that is, when Vr<Vsn−Vth. The FET Tr0 prevents a loss of voltage at SN0 during a read operation. Thus, the invention not only provides a dense memory cell that uses FET technology, but also provides nondestructive read out (NDRO) for that memory cell. No writeback/regeneration cycle is necessary, allowing for a faster cycle time than other gain cell embodiments. Furthermore, the diode D0 prevents Tr0 from conducting in the opposite direction when BLR0 is driven to ground during the read/sense operation of a gain cell that shares BLR0, such as gain cell 22. Thus, the diode of each gain cell allows a larger bitline voltage swing without read interference from unselected cells that share the same bitline. The diode also reduces the bitline capacitance.

Figure 2:
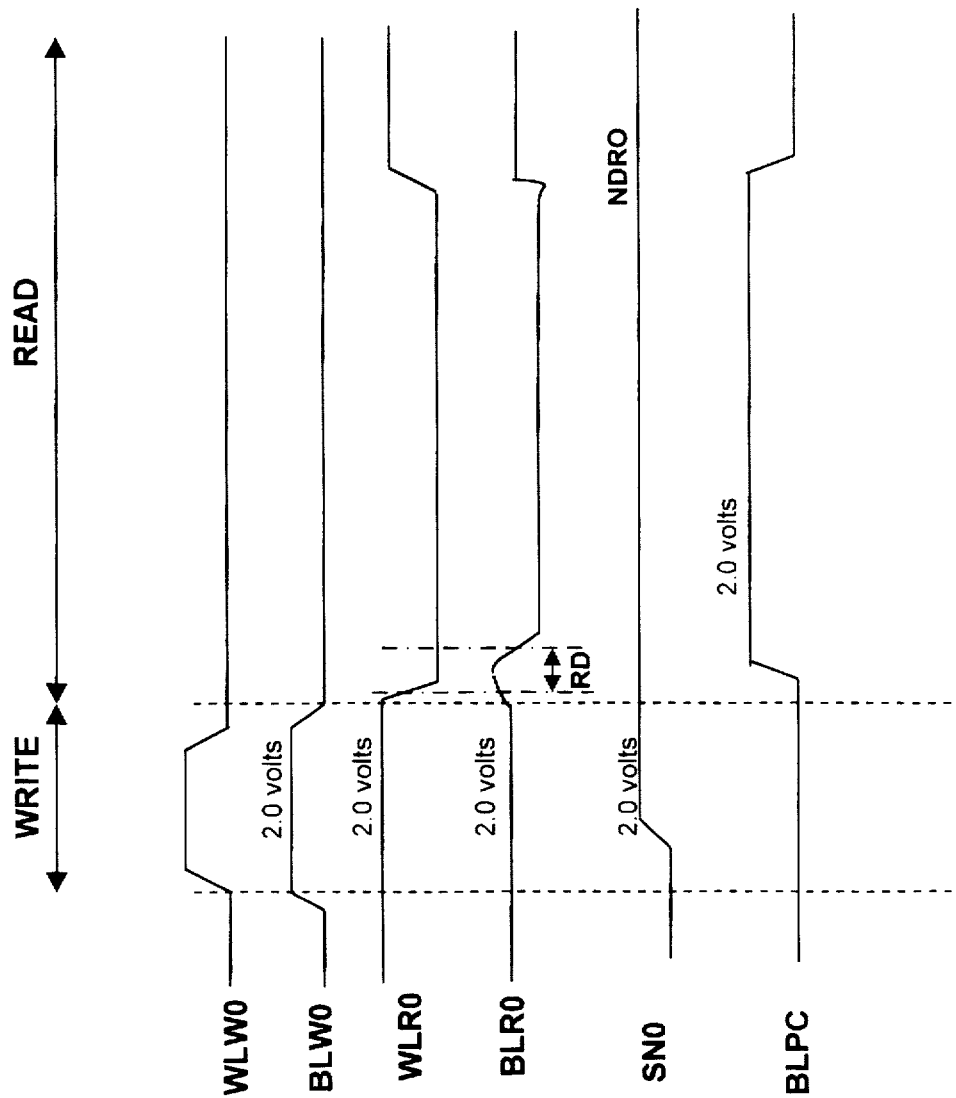
FIG. 2 is a timing diagram corresponding to FIG. 1.

FIG. 2 illustrates the operational waveforms of FIG. 1 during the read and write operations. As aforementioned, for a write operation, gain cell 20 is selected by driving WLW0 high. BLW0 is driven to a specified voltage corresponding to the binary value to be stored. In this example, 2.0 volts, or a "1" is written onto the storage node SN0. WLW0 is then returned low to isolate the cell and BLW0 restores low.

During the read operation, the voltage of the bitline precharge BLPC precharges BLR0 to 2.0 volts. WLR0 is driven low and the voltage drops on BLR0 when Vr<Vsn−Vth. Current is gated from BLR0 thru diode D0 and read transistor Tr0. The typical read delay RD for this example is substantially faster than the average read delay for conventional gain cells that do not have a diode coupled to the read bitline. Furthermore, the bitline voltage is lower than the conventional gain cells because the diode of the present invention prevents read interference from unselected cells, which limits the voltage swing of the read bitline. As aforementioned, after the read operation, there is no need for a writeback/regeneration cycle since Vsn is not significantly altered by the read operation.

Thus, this invention provides a gain cell in a memory array area that prevents read interference from unselected cells and that reduces bitline capacitance.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A gain cell circuit for a memory array having at least one read and write bitline and wordline, the gain cell circuit comprising:

a write transistor, coupled to the write bitline and the write wordline;

a storage node, coupled to said write transistor, for storing a value from the write bitline when said write transistor is activated by the write wordline;

a read transistor, coupled to said storage node and the read wordline; and a diode, coupled between the read transistor and the read bitline, for allowing a read-out of said value when said gain cell is selected and preventing a read-out of said value when said gain cell is not selected.

2. The circuit of claim 1, wherein said write transistor is a field-effect transistor having a gate, a source and a drain, said gate coupled to the write wordline, said source coupled to the write bitline, and said drain coupled to said storage node.

3. The circuit of claim 2, wherein said field-effect transistor is an n-channel field-effect transistor.

4. The circuit of claim 2, wherein said field-effect transistor is a p-channel field-effect transistor.

5. The circuit of claim 1, wherein said read transistor is a field-effect transistor having a gate, a source and a drain, said gate coupled to said storage node, said source coupled to the read wordline, and said drain coupled to said diode, said read transistor providing a nondestructive read-out of said storage node.

6. The circuit of claim 5, wherein said field-effect transistor is an n-channel field-effect transistor.

7. The circuit of claim 5, wherein said field-effect transistor is a p-channel field-effect transistor.

8. The circuit of claim 1, wherein said diode is a Schottky diode.

9. A method of preventing read interference in a gain cell memory array having at least one gain cell with a read transistor and a read bitline comprising the steps of:

a) providing a diode coupled between said read transistor and said read bitline in said gain cell;

b) storing a value in the gain cell;

c) reading out said value when said gain cell is selected; and d) preventing a read-out of said value with said diode when said gain cell is not selected.

10. The method of claim 9, wherein step a) further comprises the step of:

activating a write transistor to write said value in said gain cell.

11. The method of claim 10, further comprising the step of:

providing a field-effect transistor for said write transistor.

12. The method of claim 9, wherein step c) further comprises the step of:

activating a read transistor for reading said value in said gain cell, wherein said read transistor provides a nondestructive read-out of said gain cell.

13. The method of claim 12, further comprising the step of:

providing a field-effect transistor for said read transistor.

14. A memory array system comprising:

a read and write bitline;

a read and write wordline; and a gain cell including:

a write transistor, coupled to the write bitline and the write wordline;

a storage node, coupled to said write transistor, for storing a value from the write bitline when said write transistor is activated by the write wordline;

a read transistor, coupled to said storage node and the read wordline; and a diode, coupled between the read transistor and the read bitline, for allowing a read-out of said value when said gain cell is selected and preventing a readout of said value when said gain cell is not selected.

15. The system of claim 14, wherein said write transistor is a field-effect transistor having a gate, a source and a drain, said gate coupled to the write wordline, said source coupled to the write bitline, and said drain coupled to said storage node.

16. The system of claim 15, wherein said field-effect transistor is an n-channel field-effect transistor.

17. The system of claim 15, wherein said field-effect transistor is a p-channel field-effect transistor.

18. The system of claim 14, wherein said read transistor is an n-channel field-effect transistor having a gate, a source and a drain, said gate coupled to said storage node, said source coupled to the read wordline, and said drain coupled to said diode, said read transistor providing a nondestructive read-out of said storage node.

19. The system of claim 14, wherein said read transistor is a p-channel field-effect transistor having a gate, a source and a drain, said gate coupled to said storage node, said source coupled to the read wordline, and said drain coupled to said diode.

20. The system of claim 14, wherein said diode is a Schottky diode.

* * * * *